United States Patent
Wikus et al.

(10) Patent No.: US 10,060,998 B2
(45) Date of Patent: Aug. 28, 2018

(54) MAGNET AND CRYOSTAT ARRANGEMENT, AND METHOD FOR PASSIVE SHIMMING

(71) Applicant: Bruker BioSpin GmbH, Rheinstetten (DE)

(72) Inventors: Patrick Wikus, Nuerensdorf (CH); Volker Niemann, Ispringen (DE); Wolfgang Frantz, Karlsruhe (DE); Michael Dumm, Zurich (CH); Michael Wagenknecht, Zurich (CH); Steffen Bonn, Zurich (CH)

(73) Assignee: Bruker BioSpin GmbH, Rheinstetten (DE)

( * ) Notice: Subject to any disclaimer, the term of this patent is extended or adjusted under 35 U.S.C. 154(b) by 0 days.

(21) Appl. No.: 15/587,447

(22) Filed: May 5, 2017

(65) Prior Publication Data

US 2017/0322270 A1     Nov. 9, 2017

(30) Foreign Application Priority Data

May 6, 2016   (DE) ......................... 10 2016 207 846

(51) Int. Cl.
*G01R 33/3873* (2006.01)
*G01R 33/3815* (2006.01)
*G01R 33/38* (2006.01)

(52) U.S. Cl.
CPC ..... *G01R 33/3873* (2013.01); *G01R 33/3804* (2013.01); *G01R 33/3815* (2013.01)

(58) Field of Classification Search
CPC ............ G01R 33/3804; G01R 33/3815; G01R 33/3873
See application file for complete search history.

(56) References Cited

U.S. PATENT DOCUMENTS

| 5,834,938 A | 11/1998 | Odawara et al. |
| 6,529,005 B1 | 3/2003 | Kasten et al. |

(Continued)

FOREIGN PATENT DOCUMENTS

| DE | 19922652 A1 | 1/2001 |
| DE | 10116505 A1 | 10/2002 |

(Continued)

OTHER PUBLICATIONS

Office Action in corresponding German Application 102016207846,1, dated Jan. 13, 2017, along with English Translation.

*Primary Examiner* — Rishi Patel
(74) *Attorney, Agent, or Firm* — Edell, Shapiro & Finnan, LLC

(57) ABSTRACT

An arrangement for setting the spatial profile of a magnetic field in a working volume of a main field magnet (2), in particular a superconducting main field magnet, of a magnetic resonance installation. The main field magnet is arranged in a cryostat (1) and the spatial profile is set by a passive shim apparatus (3) with magnetic field forming elements which are arranged within the cryostat during operation and which have cryogenic temperatures. The magnetic resonance installation contains a room temperature tube (4), in which the sample volume is situated during operation. The passive shim apparatus is introduced into or removed from the cold region of the cryostat via a vacuum lock (5), without needing to ventilate the cold region of the cryostat. This provides a relatively simple, cost effective, and time-efficient method to carry out a stable field homogenization using a passive shim apparatus.

21 Claims, 7 Drawing Sheets

(56) References Cited

U.S. PATENT DOCUMENTS

| | | |
|---|---|---|
| 6,897,750 B2 | 5/2005 | Neuberth |
| 8,604,793 B2 | 12/2013 | Shen et al. |
| 2014/0061202 A1* | 3/2014 | Mathieu ............ G01R 33/3804 220/560.09 |

FOREIGN PATENT DOCUMENTS

| | | |
|---|---|---|
| JP | 2005123230 A | 5/2005 |
| JP | 2006311957 A | 11/2006 |

* cited by examiner

MAGNET AND CRYOSTAT ARRANGEMENT, AND METHOD FOR PASSIVE SHIMMING

CROSS REFERENCE TO RELATED APPLICATIONS

This application claims foreign priority under 35 U.S.C. § 119(a)-(d) to German Application No. 10 2016 207 846.1 filed on May 6, 2016, the entire contents of which are hereby incorporated by reference.

FIELD OF THE INVENTION

The invention relates to an arrangement for setting the spatial profile of a magnetic field in a sample volume of a main field magnet, in particular a superconducting main field magnet, of a magnetic resonance installation, said main field magnet being arranged in a cryostat, the spatial profile being set by a passive shim apparatus comprising one or more magnetic field forming elements which are arranged within the cryostat during operation and which have cryogenic temperatures, wherein the magnetic resonance installation contains a room temperature tube, in which the sample volume is situated during operation.

By way of example, such an arrangement is known from DE 199 22 652 C2 or from DE 101 16 505 B4.

BACKGROUND

In general, the present invention relates to the field of magnetic resonance, in particular the provision of superconducting magnet systems suitable therefor, said magnet systems being destined for producing homogeneous magnetic fields for NMR measurements. However, the applicability of the invention is not restricted to this field.

Magnetic resonance (including nuclear magnetic resonance, abbreviated "NMR", and including electron paramagnetic resonance, abbreviated "EPR") is a widespread measurement method, with which chemical compounds may be analyzed. A very homogeneous and temporally constant magnetic field is required in a sample volume to be defined, both in the field of nuclear magnetic resonance spectroscopy (NMR spectroscopy) and in imaging applications (MR imaging), said magnetic field being able to be produced by resistive or superconducting coils or a suitable permanent magnet arrangement.

Magnets which, inter alia, are characterized by a particularly high spatial homogeneity of the magnetic field in the sample space are required for nuclear magnetic resonance (NMR, MRI) applications. Usually, the employed superconducting magnets are equipped with apparatuses rendering it possible to adjust the homogeneity of the field, for example in order to compensate for faults which emerge from unavoidable manufacturing tolerances.

By way of example, "cryoshims", i.e. superconducting additional coils which, depending on requirements, are charged with a suitably selected current, are examples of such an apparatus.

Another option consists in using suitably shaped structures made of magnetic material (in particular of ferromagnetic material such as e.g. iron, which is magnetized under the influence of the field produced by the superconducting magnet, and may thus be used for field corrections in the sample space).

In some magnet systems, "homogenization structures" are fastened in the room temperature bore of the magnet, as is described, for example, in documents DE 199 22 652 C2 and DE 101 16 505 B4.

This is advantageous in that the homogenization structures can be replaced or modified very quickly, as it is not necessary to discharge or heat the magnet, or even open the housing of the magnet. Since a plurality of iterations are typically required to determine the correct end form of the homogenization structure, this drastically simplifies the homogenization of the magnet.

However, a disadvantageous effect is that the homogenization structure must firstly be subject to good temperature control. Otherwise, unwanted field changes would also arise as a result of a change in the saturation magnetization of the employed material with temperature. Secondly, it is only possible to ensure with difficulty that there is no relative movement between the superconducting magnetic coil and the homogenization structure, for example due to vibrations or thermally caused changes in length of the suspension of the coil. Such relative movement would likewise lead to unwanted changes of the field in the sample space.

In order to avoid these disadvantages, the iron structures are occasionally also fastened directly to the magnetic coil, or at least to the helium tank, in which the magnetic coil is situated, as known from DE 199 22 652 C2, cited at the outset, or from DE 101 16 505 B4.

In order to determine the ideal form of the homogenization structure, the following steps need to be carried out every time in each iteration step:
measuring the magnetic field,
discharging the magnet,
heating the cryostat to room temperature,
opening and ventilating the cryostat,
modifying the homogenization structure,
closing and evacuating the cryostat again,
filling cryogenic liquids and cooling the magnet,
recharging the magnet, and
measuring the magnetic field again.

Depending on the size of the magnet system, this process may require several weeks and is associated with considerable costs and also risks (e.g. damage to the magnet as a result of thermal cycling).

SUMMARY

By contrast, the present invention has, as an object, carrying out, cost-effectively and with simple technical measures, a field homogenization using a passive shim apparatus in a particularly time saving manner in an arrangement of the type defined at the outset. A further, related object is ensuring long-term stability of such an arrangement.

These objects are achieved by the present invention in a surprisingly simple but also effective manner by virtue of the presence of a vacuum lock, through which the passive shim apparatus or parts thereof are introduced into the cold region of the cryostat and positioned there or removed from there, without needing to ventilate the cold region of the cryostat.

The shimming process, i.e. the adaptation of the form of the magnetic elements for a refined correction of the homogeneity of the currently measured magnetic field, is iterative: after installing the magnetic field forming elements (preferably ferromagnetic field forming elements) into the magnetic resonance installation, the magnetic field is measured repeatedly, and an improved form of a new passive shim apparatus is calculated based on the results, until the homogeneity of the measured magnetic field in the sample volume corresponds to a desired level that corresponds to an optimized shim apparatus. The use of a vacuum lock may significantly accelerate the shimming process, as it thereby becomes possible to dispense with the time-consuming heating up and ventilating, or evacuating and cooling, of the cryostat between the individual iteration steps.

The utilization, according to the invention, of a vacuum lock in the cold region of the cryostat in an arrangement as described above therefore facilitates, in contrast to the solutions known from the prior art, a very significant reduction in the time which is normally required for—iteratively—setting the spatial profile of the homogeneous magnetic field in the sample volume of the magnetic resonance installation through a passive shim apparatus: instead of a—previously typical—time outlay of several weeks, the time required for the iterative shimming process now reduces to a day or a few days on account of the invention.

An embodiment of the arrangement according to the invention, in which the vacuum lock is configured to be mounted on the magnetic resonance installation, and to be removed therefrom, in an axial continuation of the room temperature bore containing the room temperature tube during operation is particularly preferred. As a result, no further openings are required in the vacuum container of the cryostat. It is possible to continue to use the existing openings. For the purposes of testing the magnet, it is sufficient to have access to the magnetic center from one side only. For use at the customer site, it is necessary to have access to the magnetic center from above and below, or from both sides in the case of horizontal magnets. It is therefore advantageous to configure the vacuum lock to be capable of being disassembled from the magnetic resonance installation.

A further embodiment provides for the vacuum lock to comprise a first valve, which is able to hermetically seal the cryostat, a vacuum chamber and a pump device which is able to evacuate the vacuum chamber, preferably by way of a second valve, or to fill or purge the chamber with fluid. An apparatus for pumping/purging allows contaminants which settle on surfaces within the vacuum lock (e.g. a thin film of water molecules) to be removed more quickly. As a result, it is possible to open the valve between vacuum lock and cryostat sooner, which has a positive effect on the test duration.

An embodiment in which a displaceable ram is arranged axially in the direction of the axis of the room temperature bore containing the room temperature tube during operation within the vacuum lock, the passive shim apparatus or parts thereof being able to be moved by the ram, is particularly preferred.

Advantageous developments of this embodiment are distinguished by virtue of the cryostat containing one or more radiation shields arranged in a radially nested manner and by virtue of cover apparatuses for sealing of the openings in the radiation shields being attachable to the magnet-side end of the ram. Such cover apparatuses avoid the helium tank being exposed to a high radiation load. This minimizes the helium consumption when the magnet is operated with the vacuum lock. Firstly, this has cost advantages; secondly, this increases the interval within which helium should be refilled, maximizing the time available for the test: in particular, it should be noted that each helium transfer interferes with the equilibrium of the system—in other words, no measurements may be carried out for approximately three days after a helium transfer has taken place.

In one class of embodiments of the arrangement according to the invention, the cryostat contains one or more radiation shields arranged in a radially nested manner, wherein the passive shim apparatus or parts thereof are connected in a heat conducting manner to one or more radiation shields, in particular to the radially innermost radiation shield adjacent to the room temperature tube, preferably on the side facing the room temperature tube, during operation of the magnetic resonance installation. The radiation shields are at least partly actively cooled, e.g. with liquid nitrogen, by a "cryocooler" or by thermal coupling to the tube through which the helium evaporates from the helium tank. If parts of the passive shim apparatus are now connected in a heat conducting manner to such an actively cooled shield, this reduces the thermal load caused by the heat conduction in the structure of the passive shim apparatus ("thermal anchoring" or "heat sinking").

In one class of alternative embodiments, the passive shim apparatus or parts thereof are attached in a heat conducting manner in the cold region of the cryostat on the outer side of a helium tank facing the room temperature tube during operation of the magnetic resonance installation. This results in two advantages: firstly, the relative position between the magnetic coil and the shim apparatus is very precise; secondly, the shim apparatus is not exposed to any temperature variations. Such temperature variations would be bothersome, as the saturation magnetization changes with temperature.

An embodiment in which provision is made of a centering device for optimized spatial setting of the installation position of the passive shim apparatus or of parts thereof in the cold region of the cryostat is also advantageous. This ensures that the position of the shim elements may be established in a reproducible manner in relation to the magnetic coil. This is important so that iterations may be carried out in an expedient manner and so that the positioning of the iron prior to delivery of the magnet to the customer from the manufacturer may be carried out in exactly the same way as in the case of the magnetic test.

A preferred embodiment is distinguished in that an apparatus for measuring the homogeneous magnetic field, in particular the magnetic field gradient, is arranged in the sample volume of the magnetic resonance installation, said apparatus having such a geometric design that it may be introduced as far as the sample volume through an open end of the room temperature bore. As a result, the magnetic field may be measured without great outlay, which in turn renders fast iterations during shimming possible.

In further preferred embodiments, provision is made of a room temperature tube which is sealed on one side and which may be used, in particular during a test phase of the magnet structures, to replace the room temperature tube which is open throughout and installed during operation of the magnetic resonance installation. The apparatus for measuring the field homogeneity may be introduced in a simple manner by way of such a tube which is sealed on one side. Moreover, a probehead and/or an electric RT shim system may be installed in a tube which is sealed on one side, without the access from the other side (for the shim elements) being blocked.

Preferably, the tube which is sealed on one side is installed from below in a vertical magnet, with the vacuum lock being seated at the top of the magnet. A further advantage emerging herefrom is that condensation formed in the bore may drip out from the bottom. Moreover, RT shim system and probehead may be installed from below, as is conventional.

These embodiments may advantageously be developed by virtue of spacer elements made of a material with a low thermal conductivity, preferably of less than 0.3 W/(m·K) at 50 K, being provided at least between two adjacent components arranged in the cold region of the cryostat, in particular between the external side of a helium tank facing the room temperature tube and a radiation shield surrounding the helium tank and/or between two adjacent radiation shields which are arranged in a radially nested manner and/or between the room temperature tube and a radiation shield. As a result, contacts between helium tank and radiation shield or between two adjacent radiation shields or between radiation shield and room temperature tube are avoided. Such contacts would lead to significantly increased helium losses or to the formation of so-called "cold spots" in the RT bore, which in turn would then lead to unwanted condensation.

An embodiment in which only a single field forming element with an integral design is provided, wherein the field forming element is constructed from a film and/or sheet, wherein the field forming element comprises recesses which are selected in terms of form, position and size in such a way that the form and amount of the remaining magnetic material leads to a desired spatial profile of the magnetic field in the sample volume of the main field magnet in the case of appropriate positioning of the film and/or of the sheet relative to the sample volume of the main field magnet, is also preferred. Such an integral structure permits particularly accurate homogenization of the magnetic field since very fine forms may be realized using modern manufacturing methods. If use is made of a thin film or thin sheet, the radial spatial requirements in the bore are very low, once again allowing the gaps in the bore to be kept very small. As a result, a very efficient magnet design is possible and the internal diameter of the innermost winding may be kept very small.

The scope of the present invention also includes a vacuum lock for use in an arrangement of the above-described type according to the invention, which is distinguished in that the vacuum lock is designed such that the passive shim apparatus or parts thereof can be introduced into the cold region of the cryostat after removal of the room temperature tube by way of the vacuum lock and can be fastened there or removed from there, without having to ventilate the cold region of the cryostat.

The scope of the present invention furthermore includes a method for setting the spatial profile of a magnetic field in a sample volume of a superconducting main field magnet in an arrangement as disclosed above, and involving the following step sequence to be carried out iteratively:
(a) measuring the magnetic field in the sample volume;
(b) introducing or replacing the passive shim apparatus, the geometry of which is based on the result of the field measurement in step (a), or of parts thereof, into or from the cold region of the cryostat through the vacuum lock;
(c) measuring the magnetic field in the sample volume again.
In particular, the main field magnet may be discharged between steps (a) and (b) and cryogenic fluid may optionally be pumped out of the cold region of the cryostat and refilled, and the main field magnet may be charged, between steps (b) and (c).

An advantageous variant of this method for operating an arrangement comprising a room temperature tube sealed on one side is distinguished by virtue of a room temperature tube which is sealed on one side being inserted into the room temperature bore of the cryostat during the test phase of the magnetic resonance installation and a room temperature tube which is open throughout being inserted into the room temperature bore of the cryostat prior to an operating phase of the magnet structures (e.g. directly before delivery to the customer).

Further advantages of the invention emerge from the description and the drawing. The features mentioned above and the features yet to be explained below may also, according to the invention, be used on their own in each case or together in any combination. The shown and described embodiments should not be understood to be a complete list but, instead, have an exemplary character for explaining the invention.

BRIEF DESCRIPTION OF THE DRAWINGS

The invention is depicted in the drawing and will be explained in more detail on the basis of exemplary embodiments. In detail.

DETAILED DESCRIPTION

Figure 1:
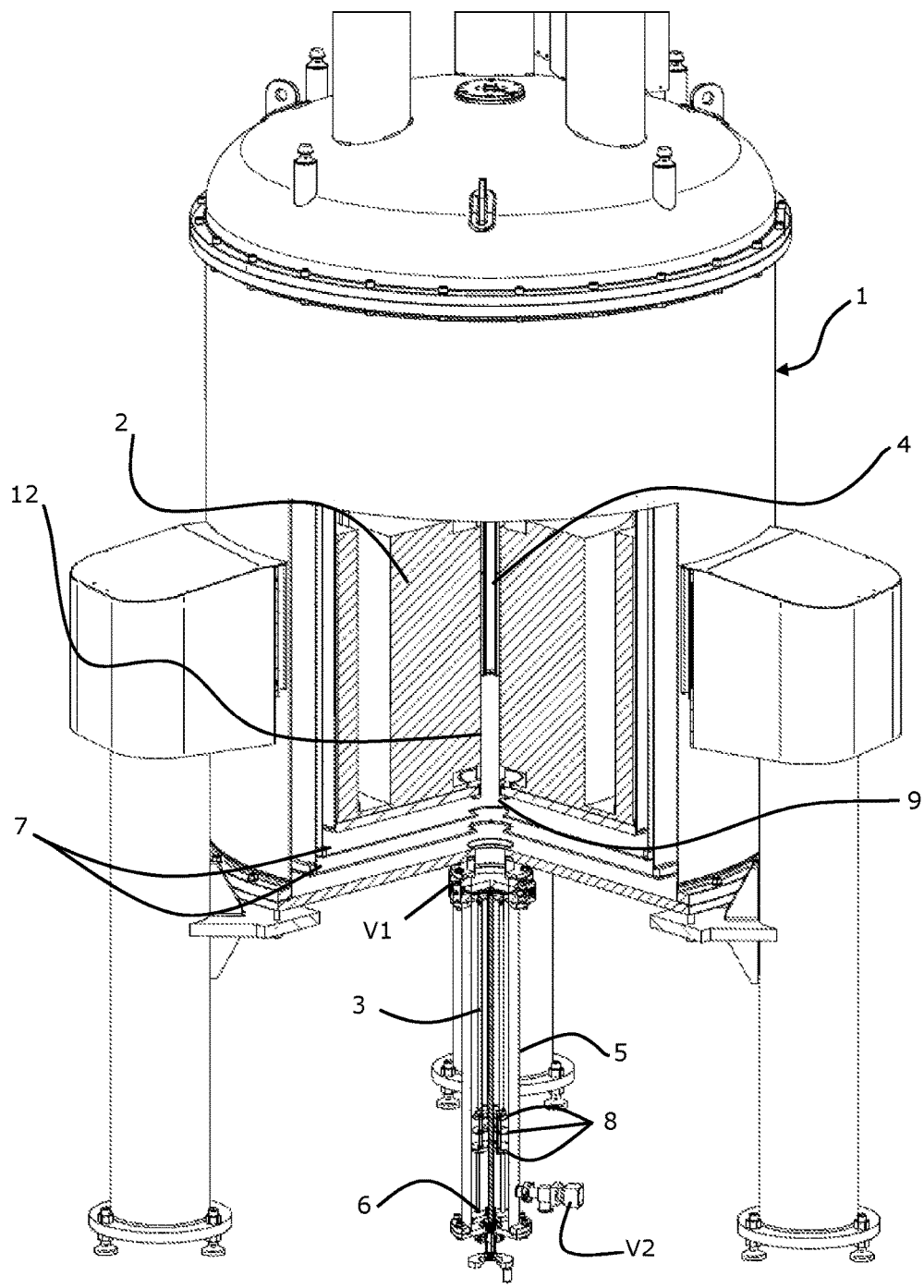
FIG. 1 shows a schematic spatial, partly cut illustration of an embodiment of the arrangement according to the invention, in which the vacuum lock is attached to the bottom of a vertical cryostat.

The arrangement according to the invention for setting the spatial profile of a homogeneous magnetic field in the direction of a z-axis in a sample volume of a main field magnet 2 finds its main application as a component of a magnetic resonance installation. The main field magnet is in particular a superconducting main field magnet, said main field magnet being arranged in a cryostat 1, as depicted schematically in FIG. 1 in a spatial partial section. The fine tuning of the homogeneous magnetic field is carried out by a passive shim apparatus 3 comprising one or more magnetic field forming elements which are arranged within the cryostat 1 during operation and which have cryogenic temperatures. The magnetic resonance installation contains a room temperature tube 4, in which the sample volume is situated during operation.

According to the invention, the arrangement includes a vacuum lock 5, through which the passive shim apparatus 3 or parts thereof may be introduced into the cold region of the cryostat 1 after removal of the room temperature tube 4 and may be fastened there or removed from there, without needing to ventilate the cold region of the cryostat 1.

Figure 2A:
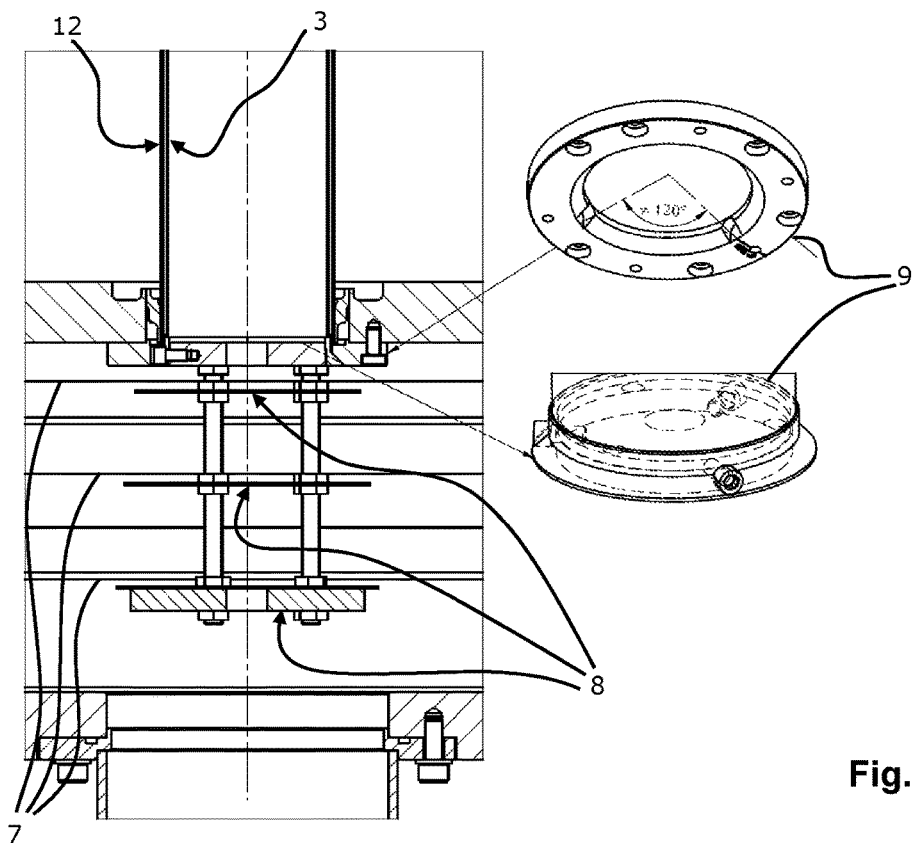
FIG. 2A shows a schematic, detailed sectional view with details of the positioning of the passive shim apparatus, which is positioned in the cryostat during the test phase, and additionally with enlarged spatial illustrations of a centering apparatus.
Figure 2B:
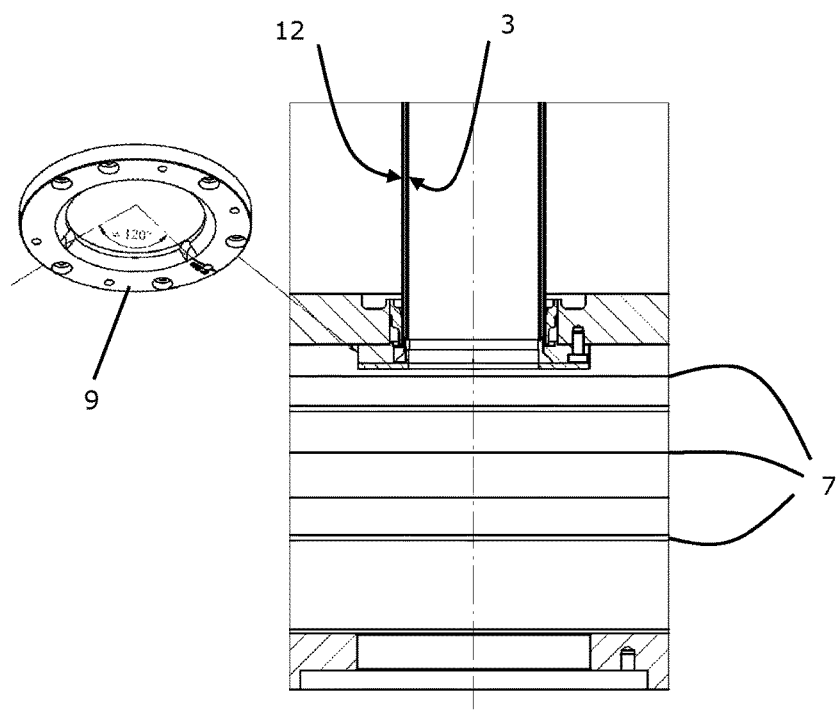
FIG. 2B shows an illustration analogous to FIG. 2A, with, however, the passive shim apparatus being depicted during normal operation.

As shown in FIGS. 2A and 2B, the vacuum lock 5 may be mounted on the magnetic resonance installation, and may be removed therefrom, in an axial continuation of the room temperature bore containing the room temperature tube 4 during operation.

The vacuum lock 5 comprises a first valve V1, which is able to hermetically seal the cryostat 1, a vacuum chamber and a pump device which is able to evacuate the vacuum chamber by way of a second valve V2 or fill or purge the chamber with fluid. For the purposes of introducing the homogenization structure into the magnet, the homogenization structure is introduced into the vacuum chamber and the vacuum chamber is pumped/purged and evacuated by way of the second valve V2. Then, the first valve V1 is opened and the homogenization structure may be pushed to the magnetic center using a suitable mechanism and may be fastened there.

A displaceable ram 6 is arranged axially in the direction of the axis of the room temperature bore containing the room temperature tube 4 during operation within the vacuum lock 5, the passive shim apparatus 3 or parts thereof being able to be moved with the ram.

The cryostat 1 contains one or more radiation shields 7 arranged in a radially nested manner. A cover apparatus 8 for one-sided sealing of the opening on the side of the room temperature bore is attachable to the magnet-side end of the ram 6, in particular for one-sided sealing of the radially innermost radiation shield adjacent to the room temperature tube 4. The cover apparatus 8 seals the opening in the thermal shield and serves as a thermalization of the ram in order to keep the thermal load on the coil tank low.

The passive shim apparatus 3 or parts thereof may be attached in a heat conducting manner to a radiation shield 7 during the operation of the magnetic resonance installation. Alternatively, or in a complementary manner, the passive shim apparatus 3 or parts thereof may be attached in a heat conducting manner in the cold region of the cryostat 1 on the outer side of a helium tank, in particular on a helium tank inner tube 12, facing the room temperature tube 4 during operation of the magnetic resonance installation.

Moreover, a centering device 9 is provided for optimized spatial setting of the installation position of the passive shim apparatus 3 or of parts thereof in the cold region of the cryostat 1.

Further, an apparatus 10 for measuring the homogeneous magnetic field, in particular the magnetic field gradient, is arranged in the sample volume of the magnetic resonance installation, said apparatus having such a geometric design that it may be introduced as far as the sample volume through an open end of the room temperature bore.

For the test operation of the magnet and for the dispatch of the installation to the customer, a room temperature tube may be provided, which is sealed on one side and which—for a while—replaces the room temperature tube 4 which is open throughout and installed during operation of the magnetic resonance installation. For the duration of the magnetic test, it is sufficient simply to press the homogenization structure against the helium tank such that the friction ensures that there is no relative movement between the coil and the homogenization structure. As a result, it is no longer necessary to establish a fixed mechanical connection (e.g. with screws) through the vacuum lock 5.

As an alternative to the variant described above, in which the apparatus 10 for measuring fields is introduced into the vacuum space of the cryostat 1, it is possible to embody the room temperature bore "in blind hole form" for the duration of the final test. This is readily obtainable, as the room temperature tubes 4 (boundary of the vacuum container and the 80 K tube) may easily be disassembled. For the purposes of measuring fields in the final test, it is sufficient if access to the magnetic center only exists from one side of the magnet. When the magnet is installed in the customer laboratory, the blind-hole-shaped tubes are replaced by conventional tubes and access to the magnetic center is given from both sides.

By way of spacer elements 11 made of a material with a low thermal conductivity, the room temperature tube 4 which is sealed on one side is spatially separated by a predetermined distance from the external side of the helium tank facing the room temperature tube or from a radiation shield 7 surrounding the helium tank in order to avoid thermal shorts between the blind-hole-shaped inner tubes or between the 80 K tube and the helium tank.

In detail, FIG. 2A shows a detailed schematic sectional view of how the passive shim apparatus 3 is positioned during the test in the cryostat 1, how parts are in thermal contact with the radiation shields 7 and how another part of the helium tank is contacted at the helium tank inner tube 12 (in this case by way of the centering device 9 which, for the purposes of an improved presentation, is also shown again in a spatial and magnified manner). It is possible to see the cover apparatuses 8 which seal the openings in the radiation shields 7. Once again, the vacuum lock 5 is applied to the cryostat 1 at the bottom.

FIG. 2B shows a detailed view of how the passive shim apparatus 3 is attached during normal operation at the customer site. The centering device 9, which has a conical surface and which is fastened to the helium tank, serves as a receptacle for an appropriately shaped counterpiece on the shim apparatus 3. The shim apparatus 3 is now directly screwed onto the helium tank and not pressed against the tank by the ram 6 during normal operation.

The centering device 9 is a conically embodied receptacle which is fixedly screwed to the helium tank or directly integrated into the helium tank. The carrier cylinder, on which the iron is fastened, likewise has a conical form (the two parts fit into one another). As a result of this conical contact, the carrier cylinder is centered in the receptacle at the helium tank when the carrier cylinder is moved to the magnetic center by the mechanism situated in the vacuum lock 5. Moreover, the cone offers a "stop", by which the z-position of the carrier cylinder (and hence of the iron) is fixedly defined. As a result, one degree of freedom still remains, namely the rotation about the z-axis. It is fixed by a recess, into which a "lug" situated at the carrier cylinder fits. The design may provide for three of such lugs/recesses which, however, should not be respectively offset by 120°, so that there is only one possible defined position.

Figure 3:
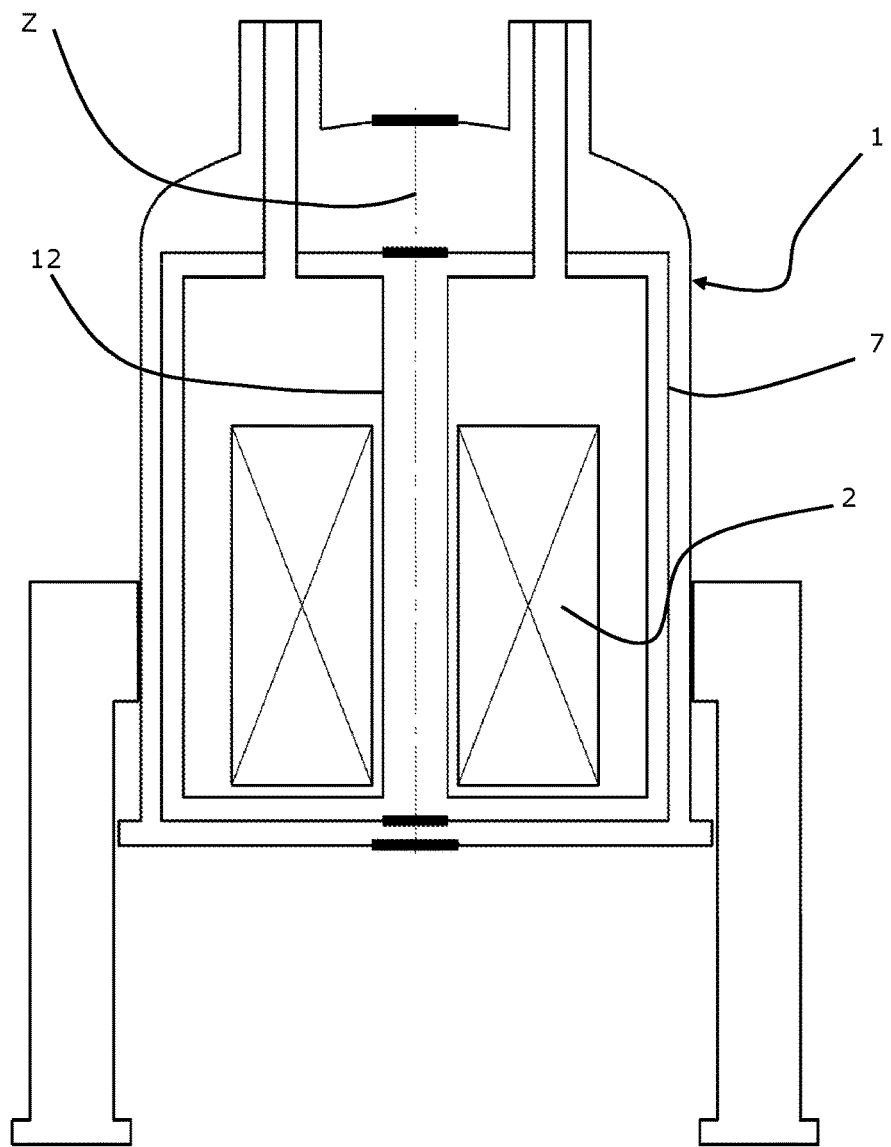
FIG. 3 shows a schematic sectional illustration of an embodiment of the arrangement according to the invention, comprising a magnetic coil and radiation shield, from which, however, the room temperature tube which is open throughout and present during normal operation, and the radiation shield situated in the bore have been removed.

FIG. 3 schematically shows the cryostat 1 with magnetic coil 3 and radiation shield 7, with the room temperature tube 4 which is open throughout and present during normal operation, and all radiation shields situated in the bore having been removed.

Figure 4:
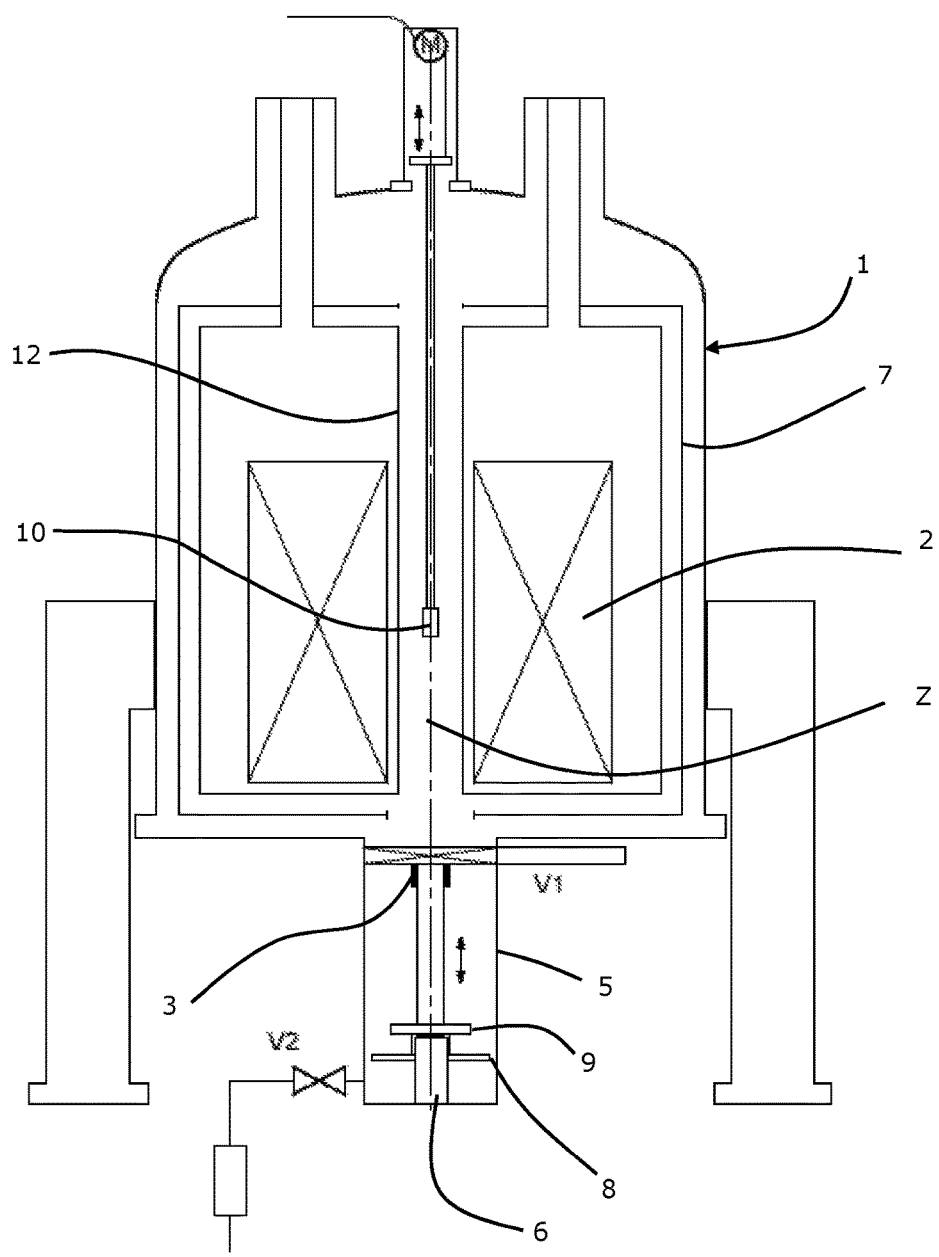
FIG. 4 shows the arrangement according to FIG. 3, comprising a device for measuring the magnetic field and a vacuum lock attached to the bottom.

FIG. 4 shows the cryostat 1 of FIG. 3, with an apparatus 10 for measuring the magnetic field having been attached to the top and a vacuum lock 5 having been attached to the bottom. Here, the apparatus 10 for measuring the magnetic field protrudes into the sample volume from above. The inverted arrangement, i.e. vacuum lock 5 on the top and measuring apparatus 10 at the bottom, is likewise possible, but not depicted separately in the drawing.

Figure 5:
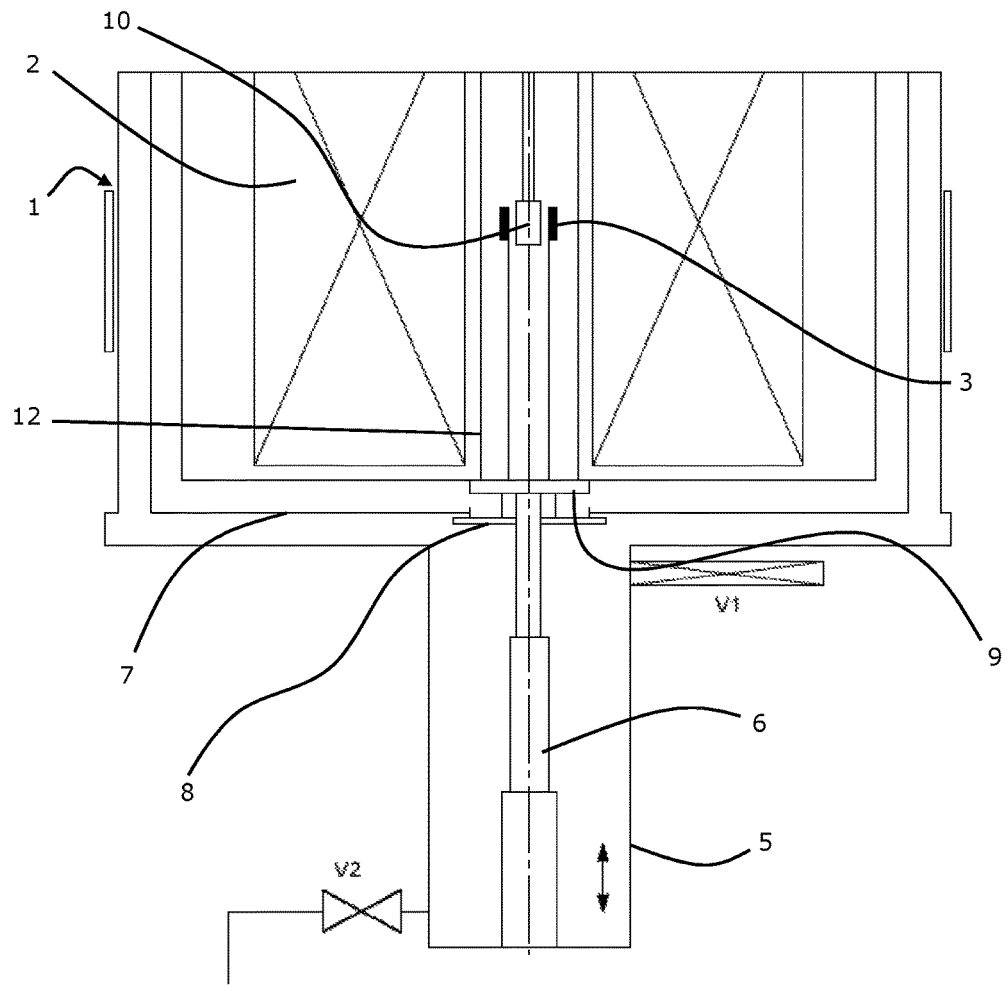
FIG. 5 shows a schematic sectional view with details of the vacuum lock attached to the cryostat.

FIG. 5 shows a detailed view of the vacuum lock 5 comprising valve 1 (connection to the cryostat vacuum) and valve 2 (for pumping/purging). The ram 6 has positioned the passive shim apparatus 3 at the helium tank; the cover apparatus 8 seals the opening in the shown radiation shield 7.

Figure 6:
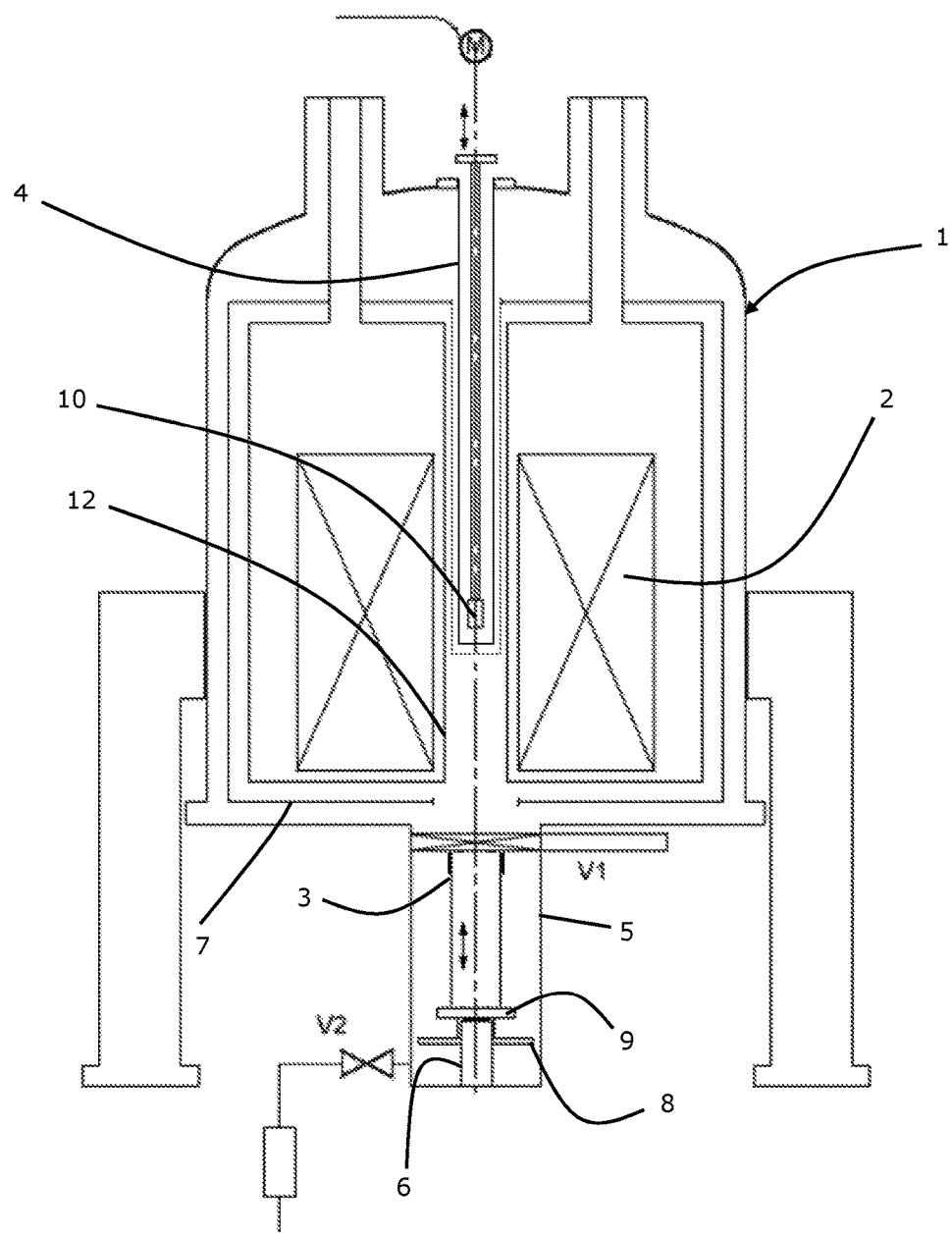
FIG. 6 shows the arrangement according to FIG. 3, comprising a vacuum lock attached to the bottom and a room temperature tube which is sealed on one side and introduced from the top, and a radiation shield in the bore, said radiation shield being sealed on one side.

In FIG. 6, a vacuum lock 5 has been attached to the cryostat 1 of FIG. 3 at the bottom. A room temperature tube 4 which is sealed on one side and a radiation shield 7 which is sealed on one side are installed in the bore from above, with the inverted arrangement once again also being possible here. Then, the apparatus 10 for measuring the magnetic field is not situated in the cryostat vacuum, but may be guided into the sample volume through the room temperature tube 4 which is sealed on one side.

Figure 7:
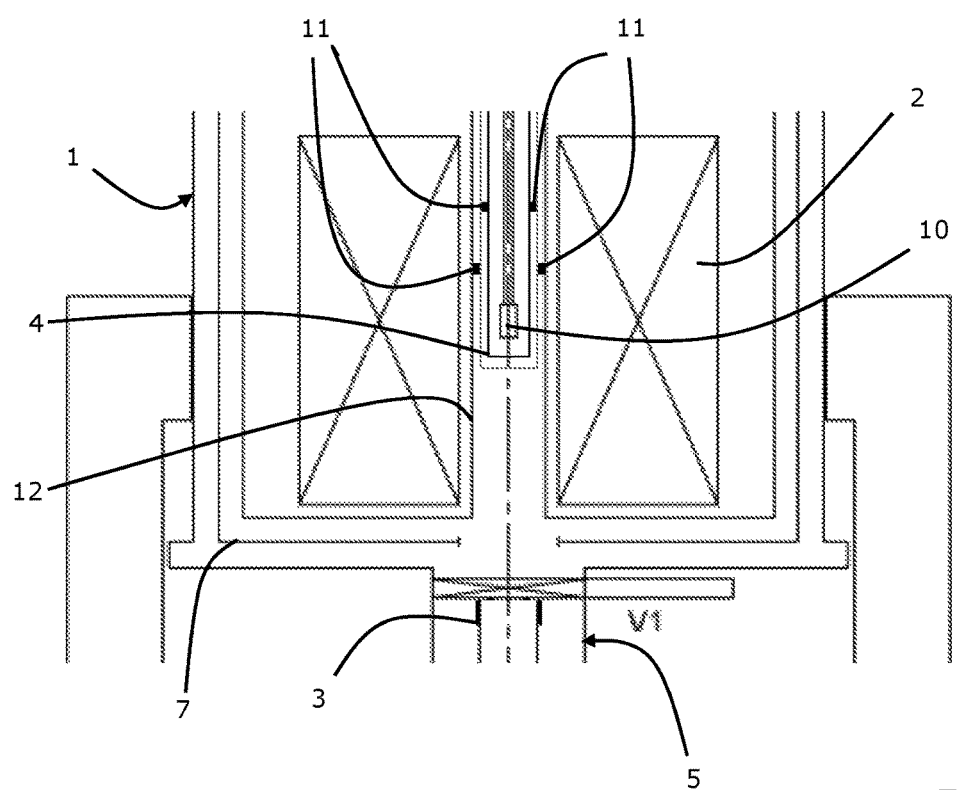
FIG. 7 shows a detailed view of the spacer elements.

Finally, FIG. 7 shows a detailed view of the spacer elements 11 made of a material with a low thermal conductivity, said spacer elements preventing the room temperature tube 4, radiation shields 7 or helium tank tube 12 from contacting one another. Such a contacting would lead to thermal shorts and, as a consequence thereof, to an increased thermal load on the cold components of the cryostat 1 and/or to the formation of cold spots and condensation in the room temperature tube 4.

In embodiments of the invention not depicted on their own in the drawing, the passive shim apparatus 3 may comprise a field forming element, in particular a single field forming element, with an integral design, which is constructed from a film and/or sheet and which comprises recesses which are selected in terms of form, position and size in such a way that the form and amount of the remaining ferromagnetic material leads to a desired spatial profile of the magnetic field in the sample volume of the main field magnet 2 in the case of appropriate positioning of the film and/or of the sheet relative to the sample volume of the main field magnet 2.

The present invention may be used for all magnet systems. Under certain circumstances, the solution is of particular interest for UHF NMR magnets with HTS windings, since the size of the systems requires particularly long times for the steps of charging/discharging/heating/cooling and active cryoshim coils are inefficient as a result of the shielding effect of the HTS windings.

LIST OF REFERENCE SIGNS

1 Cryostat
2 Main field magnet
3 Passive shim apparatus
4 Room temperature tube
5 Vacuum lock
6 Displaceable ram
7 Radiation shield(s)
8 Cover apparatus
9 Centering device
10 Apparatus for measuring the magnetic field
11 Spacer element
12 Helium tank inner tube
V1 First valve
V2 Second valve
z z-axis

What is claimed is:

1. An arrangement for setting the spatial profile of a magnetic field in a working volume of a main field magnet of a magnetic resonance installation, comprising:
   a main field magnet arranged in a cryostat having a cold region,
   a passive shim apparatus for forming the spatial profile and comprising at least one magnetic field forming element arranged within the cryostat during operation and having a cryogenic temperature,
   a room temperature tube, in which the sample volume is situated during the operation, and
   a vacuum lock configured to introduce and/or remove at least parts of the passive shim apparatus into the cold region of the cryostat without needing to ventilate the cold region of the cryostat.

2. The arrangement as claimed in claim 1, wherein the vacuum lock is configured to be mounted on or removed from the magnetic resonance installation, in an axial continuation of a room temperature bore that is configured to receive the room temperature tube during the operation.

3. The arrangement as claimed in claim 1, wherein the vacuum lock comprises a first valve configured to hermetically seal the cryostat, a vacuum chamber, and a pump device which is configured to evacuate the vacuum chamber or to fill or to purge the chamber with fluid.

4. The arrangement as claimed in claim 1, further comprising a displaceable ram arranged axially in a direction of an axis of a room temperature bore that contains the room temperature tube during the operation within the vacuum lock, wherein at least the parts of the passive shim apparatus are arranged to be moved by the ram.

5. The arrangement as claimed in claim 4, wherein the cryostat comprises at least one radiation shield, and further comprising a cover apparatus for one-sided sealing of an opening on a side of the room temperature bore configured to attach to a magnet-side end of the ram.

6. The arrangement as claimed in claim 1, wherein the cryostat comprises at least one radiation shield, and wherein at least parts of the passive shim apparatus are attached in a heat conducting manner to the at least one radiation shield.

7. The arrangement as claimed in claim 1, wherein at least parts of the passive shim apparatus are attached in a heat conducting manner in a cold region of the cryostat on an outer side of a helium tank facing the room temperature tube during the operation of the magnetic resonance installation.

8. The arrangement as claimed in claim 1, further comprising a centering device configured to optimize a spatial setting of an installation position of at least parts of the passive shim apparatus in a cold region of the cryostat.

9. The arrangement as claimed in claim 1, further comprising an apparatus configured to measure the homogeneous magnetic field and arranged in the sample volume of the magnetic resonance installation, the apparatus being geometrically configured to be introduced as far as the sample volume through an open end of the room temperature bore.

10. The arrangement as claimed in claim 1, further comprising a room temperature tube which is sealed on one side and which is configured to replace the room temperature tube which is open throughout and is installed during the operation of the magnetic resonance installation.

11. The arrangement as claimed in claim 10, wherein spacer elements made of a material with a thermal conductivity of less than 0.3 W/(m·K) at 50 K spatially separate the room temperature tube by a predetermined distance from an external side of a helium tank facing the room temperature tube or from a radiation shield surrounding the helium tank.

12. The arrangement as claimed in claim 1, wherein the passive shim apparatus comprises a field forming element with an integral design, wherein the field forming element is constructed from a film and/or sheet, wherein the field forming element comprises recesses which are selected in terms of form, position and size such that the form and amount of the remaining ferromagnetic material leads to a desired spatial profile of the magnetic field in the sample volume of the main field magnet in response to appropriate positioning of the film and/or of the sheet relative to the sample volume of the main field magnet.

13. A vacuum lock for use in an arrangement as claimed in claim 1, wherein the vacuum lock is configured such that at least parts of the passive shim apparatus can be introduced into or removed from the cold region of the cryostat after removal of the room temperature tube which is open throughout by way of the vacuum lock, without having to ventilate the cold region of the cryostat.

14. A method for setting the spatial profile of a magnetic field in a sample volume of a superconducting main field magnet in an arrangement as claimed in claim 1, comprising:
    (a) measuring the magnetic field in the sample volume;
    (b) introducing or replacing at least parts of the passive shim apparatus, the geometry of which is based on the result of the field measurement in step (a), into or from the cold region of the cryostat through the vacuum lock; and
    (c) again measuring the magnetic field in the sample volume.

15. The method as claimed in claim 14,
    wherein the arrangement comprises a room temperature tube which is sealed on one side and which is configured to replace the room temperature tube which is open throughout and is installed during the operation of the magnetic resonance installation,
    wherein, during the operating phases of the magnetic resonance installation, the room temperature tube which is open throughout is inserted into the room temperature bore of the cryostat and
    wherein a room temperature tube which is sealed on one side is introduced into the room temperature bore of the cryostat prior to a testing phase of the magnet.

16. The arrangement as claimed in claim 1, wherein the main field magnet is a superconducting main field magnet.

17. The arrangement as claimed in claim 3, wherein the vacuum lock comprises a second valve configured to evacuate the vacuum chamber.

18. The arrangement as claimed in claim 5, wherein the cryostat comprises a plurality of radially nested radiation shields, and wherein the cover apparatus for the one-sided sealing of the opening on the side of the room temperature bore configured to attach to a magnet-side end of the ram for one-sided sealing of a radially innermost radiation shield arranged adjacent to the room temperature tube.

19. The arrangement as claimed in claim 6, wherein the cryostat comprises a plurality of radially nested radiation shields, and wherein at least parts of the passive shim apparatus are configured to attach to a radially innermost radiation shield adjacent to the room temperature tube on a side facing the room temperature tube during the operation of the magnetic resonance installation.

20. The arrangement as claimed in claim 9, wherein the apparatus is configured to measure the magnetic field gradient.

21. The arrangement as claimed in claim 1, wherein the passive shim apparatus comprises a single field forming element with an integral design, wherein the single field forming element is constructed from a film and/or sheet, wherein the single field forming element comprises recesses which are selected in terms of form, position and size such that the form and amount of a remaining ferromagnetic material leads to a desired spatial profile of the magnetic field in the sample volume of the main field magnet in response to appropriate positioning of the film and/or of the sheet relative to the sample volume of the main field magnet.

* * * * *